US012733431B2

(12) United States Patent
Wu et al.

(10) Patent No.: US 12,733,431 B2
(45) Date of Patent: Sep. 8, 2026

(54) SEMICONDUCTOR SYSTEM WITH AN INTEGRATED WAFER HUMIDITY CONTROL DEVICE

(71) Applicant: Taiwan Semiconductor Manufacturing Company, Ltd., Hsin-Chu (TW)

(72) Inventors: Cheng-Lung Wu, Miaoli County (TW); Yi-Fam Shiu, Miaoli County (TW); Yang-Ann Chu, Hsinchu City (TW); Hsu-Shui Liu, Pingjhen City (TW)

(73) Assignee: TAIWAN SEMICONDUCTOR MANUFACTURING COMPANY, LTD, Hsinchu (TW)

( * ) Notice: Subject to any disclaimer, the term of this patent is extended or adjusted under 35 U.S.C. 154(b) by 1003 days.

(21) Appl. No.: 17/885,199

(22) Filed: Aug. 10, 2022

(65) Prior Publication Data

US 2023/0369082 A1 Nov. 16, 2023

Related U.S. Application Data

(60) Provisional application No. 63/340,243, filed on May 10, 2022.

(51) Int. Cl.
*H10P 72/00* (2026.01)

(52) U.S. Cl.
CPC ...... *H10P 72/0464* (2026.01); *H10P 72/0402* (2026.01)

(58) Field of Classification Search
CPC .......... H01L 21/67196; H01L 21/67017; F24F 13/068; F24F 7/10; F24F 9/00
See application file for complete search history.

(56) References Cited

U.S. PATENT DOCUMENTS 8,796,666 B1 8/2014 Huang et al.
8,837,810 B2 9/2014 Chen et al.
(Continued)

FOREIGN PATENT DOCUMENTS

JP 2010019483 1/2010
JP 2021007172 1/2021
(Continued)

OTHER PUBLICATIONS

How to Select the Right Rubber Component for Your Application, Apr. 16, 2021, Thomas A. Caserta, Inc https://www.casertainc.com/rubber-component-selection-guide/ (Year: 2021).*

*Primary Examiner* — Michael James Giordano
(74) *Attorney, Agent, or Firm* — HAYNES AND BOONE, LLP

(57) ABSTRACT

The present disclosure provides an embodiment of a semiconductor fabrication system. The semiconductor fabrication system includes an equipment front end module with a load port to transfer semiconductor wafers to the equipment front end module from a wafer carrier; and a wafer humidity control device embedded in the equipment front end module and configured to generate an air curtain to protect the semiconductor wafers. The wafer humidity control device further includes a gas entry layer with a gas inlet to receive a gas; a uniform layer integrated with the gas entry layer and designed to redistribute the gas; and a diversion structure having multiple pieces assembled together to hold the uniform layer and integrated with the gas entry layer.

18 Claims, 11 Drawing Sheets

(56) References Cited

U.S. PATENT DOCUMENTS

| | | | |
|---|---|---|---|
| 9,093,530 B2 | 7/2015 | Huang et al. | |
| 9,134,633 B2 | 9/2015 | Lin et al. | |
| 9,230,867 B2 | 1/2016 | Cheng et al. | |
| 9,304,403 B2 | 4/2016 | Lin et al. | |
| 9,404,743 B2 | 8/2016 | Chiu et al. | |
| 9,548,303 B2 | 1/2017 | Lee et al. | |
| 9,823,585 B2 | 11/2017 | Shih et al. | |
| 9,841,687 B2 | 12/2017 | Lee et al. | |
| 2012/0134103 A1* | 5/2012 | Tan | H05K 7/20736 312/236 |
| 2015/0024671 A1* | 1/2015 | Taniyama | H01L 21/67772 454/193 |
| 2020/0058532 A1* | 2/2020 | Yang | H01L 21/67386 |
| 2020/0149776 A1* | 5/2020 | Leiterman | F24F 13/0218 |
| 2021/0090923 A1 | 3/2021 | Woo et al. | |
| 2022/0034532 A1* | 2/2022 | Hu | F24F 9/00 |
| 2023/0343584 A1* | 10/2023 | Hsu | H01L 21/02263 |

FOREIGN PATENT DOCUMENTS

| | | | |
|---|---|---|---|
| KR | 20200031185 | 3/2020 | |
| TW | M565395 U * | 8/2018 | |
| WO | WO-2005080883 A1 * | 9/2005 | B01D 46/58 |

* cited by examiner

SEMICONDUCTOR SYSTEM WITH AN INTEGRATED WAFER HUMIDITY CONTROL DEVICE

PRIORITY DATA

This application claims priority to U.S. Provisional Patent Application Ser. No. 63/340,243 filed May 10, 2020, the entire disclosure of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing, and for these advancements to be realized, similar developments in IC processing and manufacturing are needed.

For example, in the fabrication of ICs, controls to particle, moisture, and other contamination are more challenging. Even smaller particles may be yield-killing defects and need to be eliminated or substantially reduced. In other example, the existing humidity control device has a structure that may introduce stress, deformation and other defects, defeating the desired functions. It is therefore desired to have a semiconductor system the methods making and utilizing the same to address the above issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
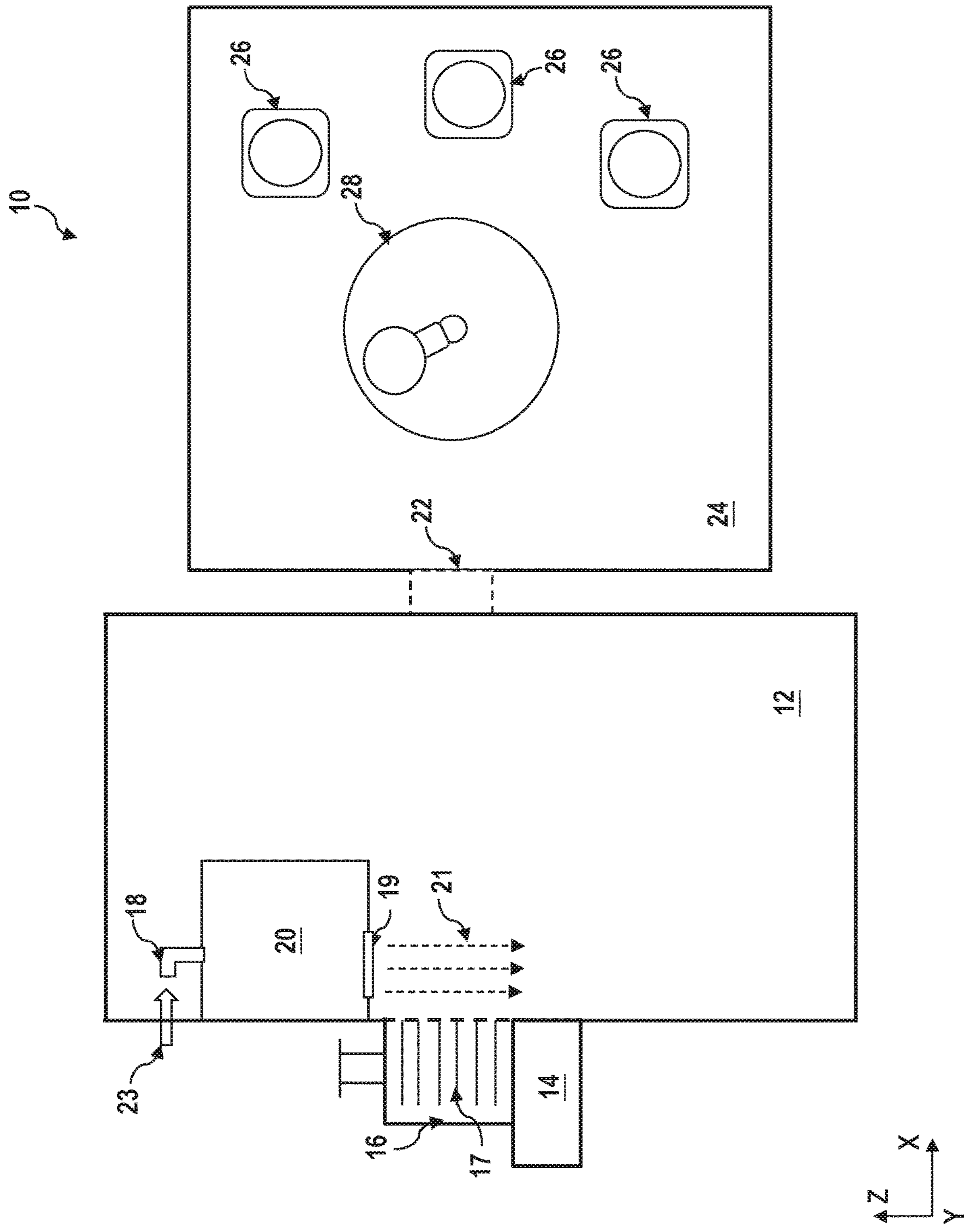
FIG. 1 is a block diagram of a semiconductor system having a wafer humidity control device, constructed according to various aspects of the present disclosure in one embodiment.

The present disclosure relates generally to a semiconductor fabrication system. The following disclosure provides many different embodiments, or examples, for implementing different features. Reference numerals and/or letters may be repeated in the various examples described herein. This repetition is for the purpose of simplicity and clarity and does not in itself dictate a relationship between the various disclosed embodiments and/or configurations. Further, specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. Moreover, the formation of a feature on, connected to, and/or coupled to another feature in the present disclosure may include embodiments in which the features are formed in direct contact, and may also include embodiments in which additional features may be formed interposing the features, such that the features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one feature relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described, or other values as understood by person skilled in the art. For example, the term "about 5 nm" encompasses the dimension range from 4.5 nm to 5.5 nm.

The present disclosure provides various embodiments of an integrated circuit (IC) system (or a semiconductor system) with an integrated wafer humidity control device. The integrated wafer humidity control device has a design, a structure and a method assembling the same with reduced stress and deformation.

FIG. 1 is a schematic view of an integrated circuit (IC) system (also referred to as a semiconductor system) 10, constructed according to various aspects of the present disclosure in one embodiment. In some embodiments, the semiconductor system 10 is designed for semiconductor fabrication. The semiconductor system 10 includes an equipment front end module (EFEM) 12 designed as a module for transporting semiconductor wafers (or photomasks) between ultra-clean storage carriers and a variety of systems (also referred to as a processing system) for processing, measurement and testing. The processing implemented in the processing system includes deposition, etching, ion implantation, photolithography process, and a combination thereof.

The EFEM 12 includes one or more load port 14 designed to receive semiconductor wafers and transfer the semiconductor wafers from a wafer carrier 16 to a processing tool 24. The wafer carrier 16 is a container designed to hold and transfer one or multiple semiconductor wafers 17 and protect thereof during the transportation. In the disclosed embodiment, the wafer carrier 16 is a front opening unified pod (FOUP) designed to hold semiconductor wafers 17, such as 300 mm silicon wafers.

The semiconductor system 10 further includes one or more processing tool 24 coupled with the EFEM 12 through an interface 22 so that the semiconductor wafers are able to be transferred between the EFEM 12 and the processing tool 24. The processing tool is a platform to applying to the semiconductor wafers 17 with one or more processes, such as fabrications, measurements, testing, and a combination thereof. In some examples, the fabrications include deposition, etching, ion implantation, chemical mechanical polishing (CMP), photolithography process, other suitable processes or a combination thereof. In some examples, the measurements include measuring electrical resistance, reflectivity, particles and contamination, electrical measurements, other suitable measurements, or a combination thereof. In some examples, the testing includes testing to screen failed chips after the completion of the IC fabrication and before dicing.

In the disclosed embodiment for illustration, the processing tool 24 is a deposition apparatus, such as chemical vapor deposition (CVD), or physical vapor deposition (PVD). In furtherance of the embodiment, the deposition apparatus 24 includes one or more wafer stage 26 designed to secure one or more semiconductor wafer during deposition and is able to move, such as rotational and/or transitional movements. The deposition apparatus 24 may also include one or more robot 28 to transfer a semiconductor wafer between the EFEM 12 and the wafer stages 26 or among the wafer stages 26.

Back to the EFEM 12, the EFEM 12 includes a wafer humidity control device (WHCD) 20 embedded in and integrated with the EFEM 12. The WHCD 20 is a device designed to control the humidity of the semiconductor wafers 17 stored in the wafer carrier 16 secured on the load port 14. The WHCD 20 includes various components integrated with a mechanism to control the humidity. Particularly, the WHCD 20 includes a gas inlet 18 coupled to a gas source to provide a gas 23 and a gas outlet 19 so that the gas 23 is directed out from the WHCD 20 with a proper gas flow direction, pressure and distribution, thereby forming an air curtain (or a gas wall) 21 to isolate and protect the semiconductor wafers 17 stored in the wafer carrier 16 from the environmental humidity. The gas 23 may include extreme clean dry air (XCDA), nitrogen gas ($N_2$), other suitable gas or a combination thereof. The WHCD 20 is further described in FIGS. 2A and 2B.

Figure 2A:
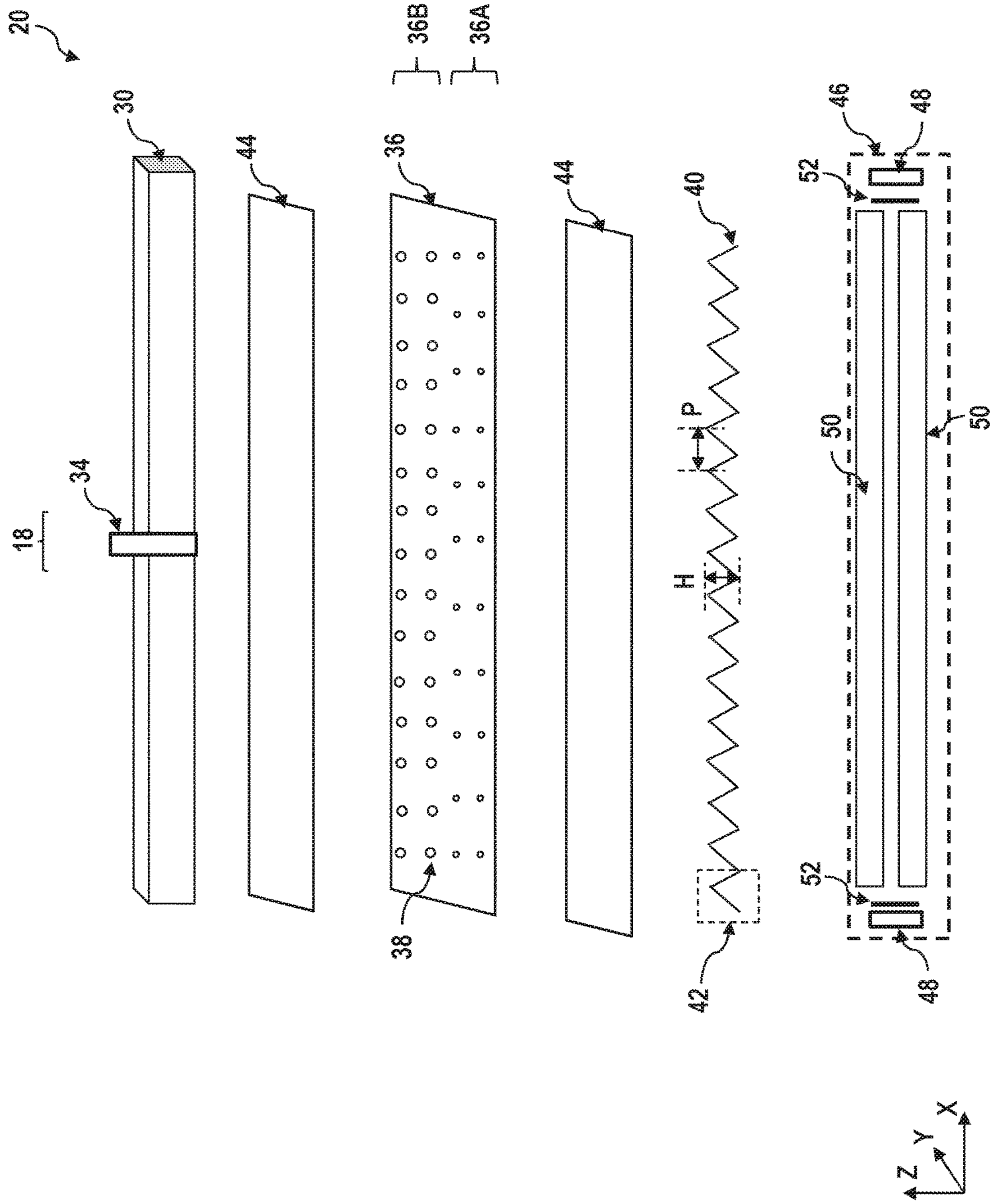
FIGS. 2A and 2B are schematic views of the wafer humidity control device of FIG. 1, constructed according to various aspects of the present disclosure in some embodiments.
Figure 2B:
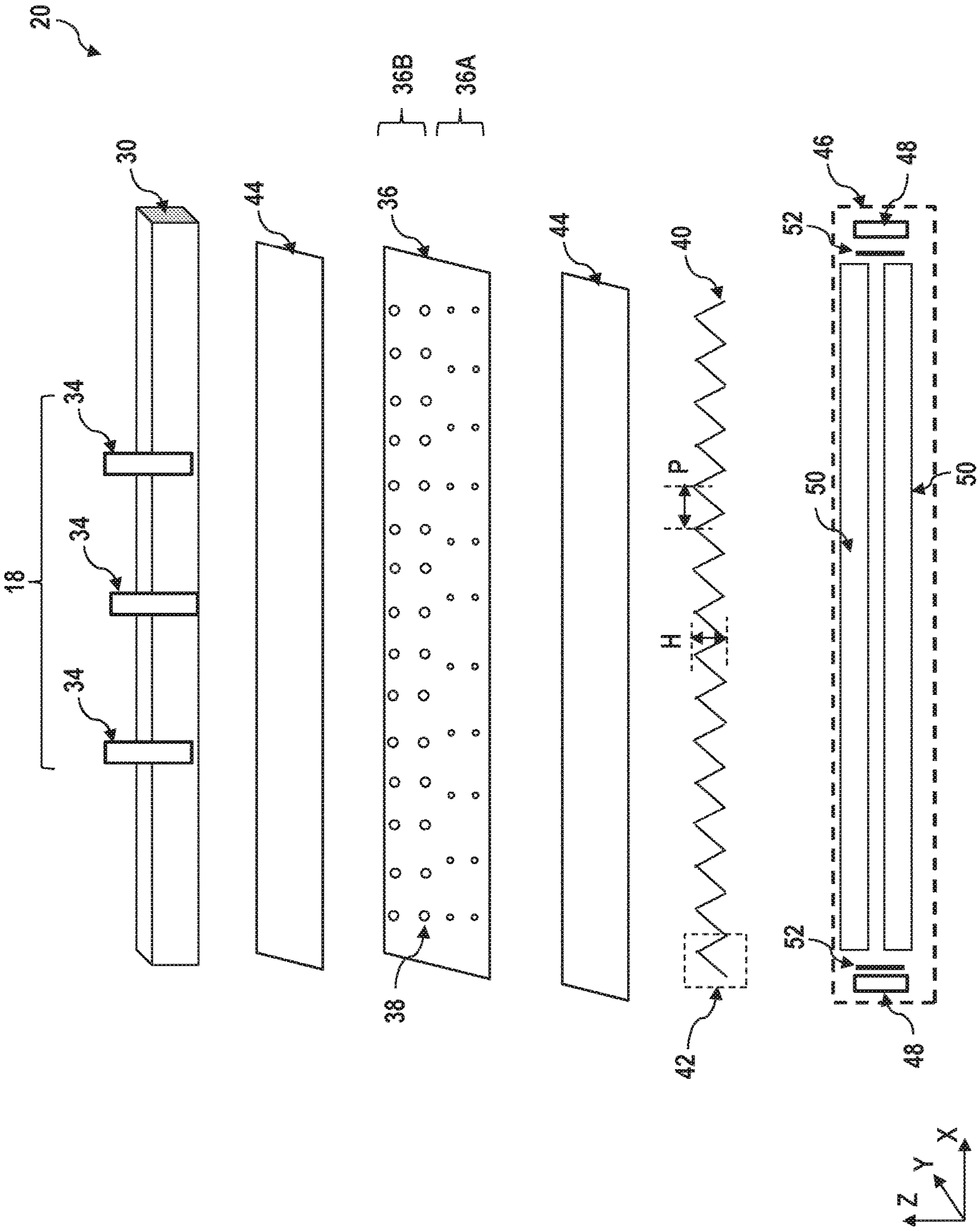
Figure 2C:
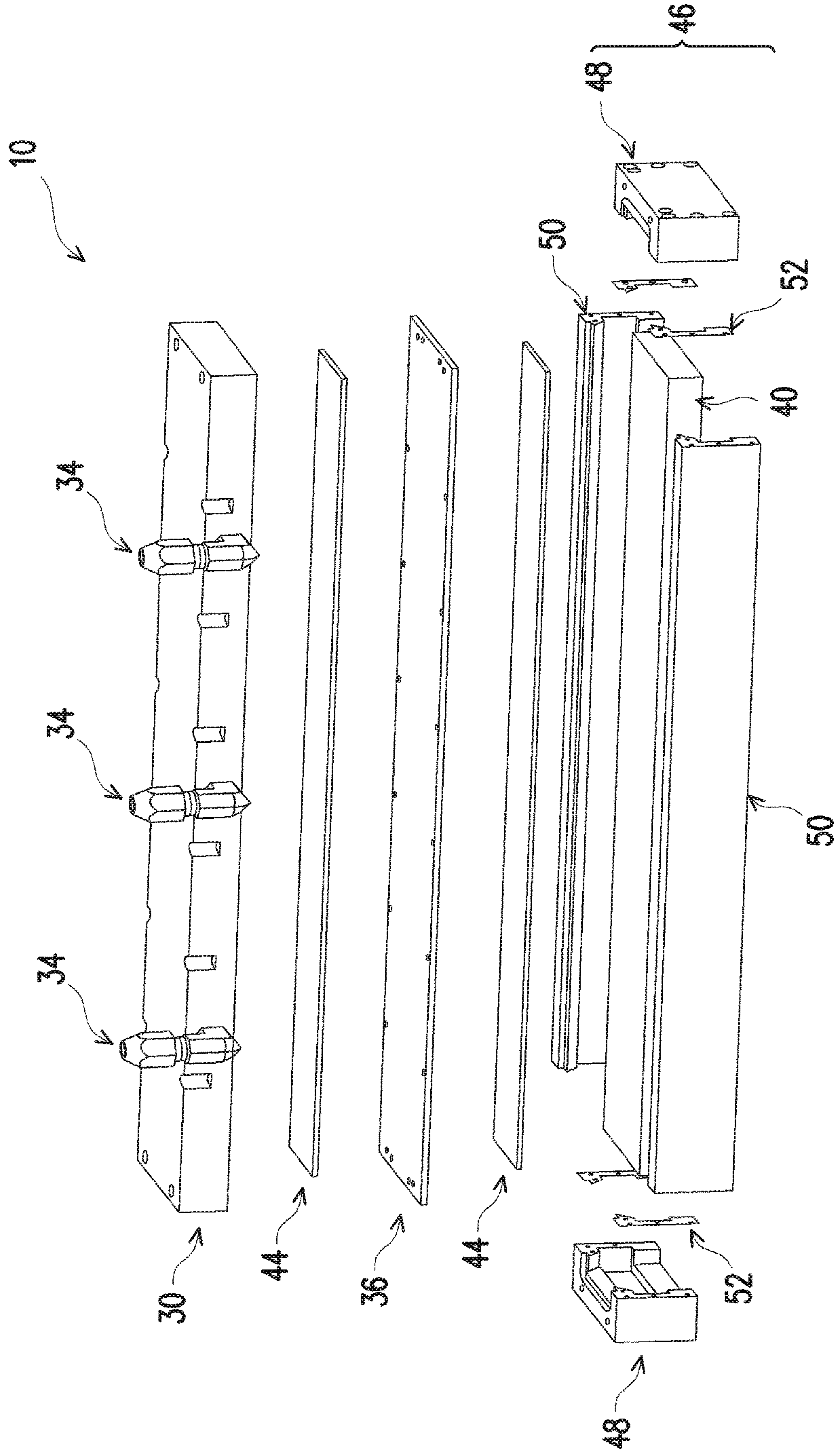
FIG. 2C is a perspective view of the wafer humidity control device of FIG. 2B constructed according to some embodiments.
Figure 2D:
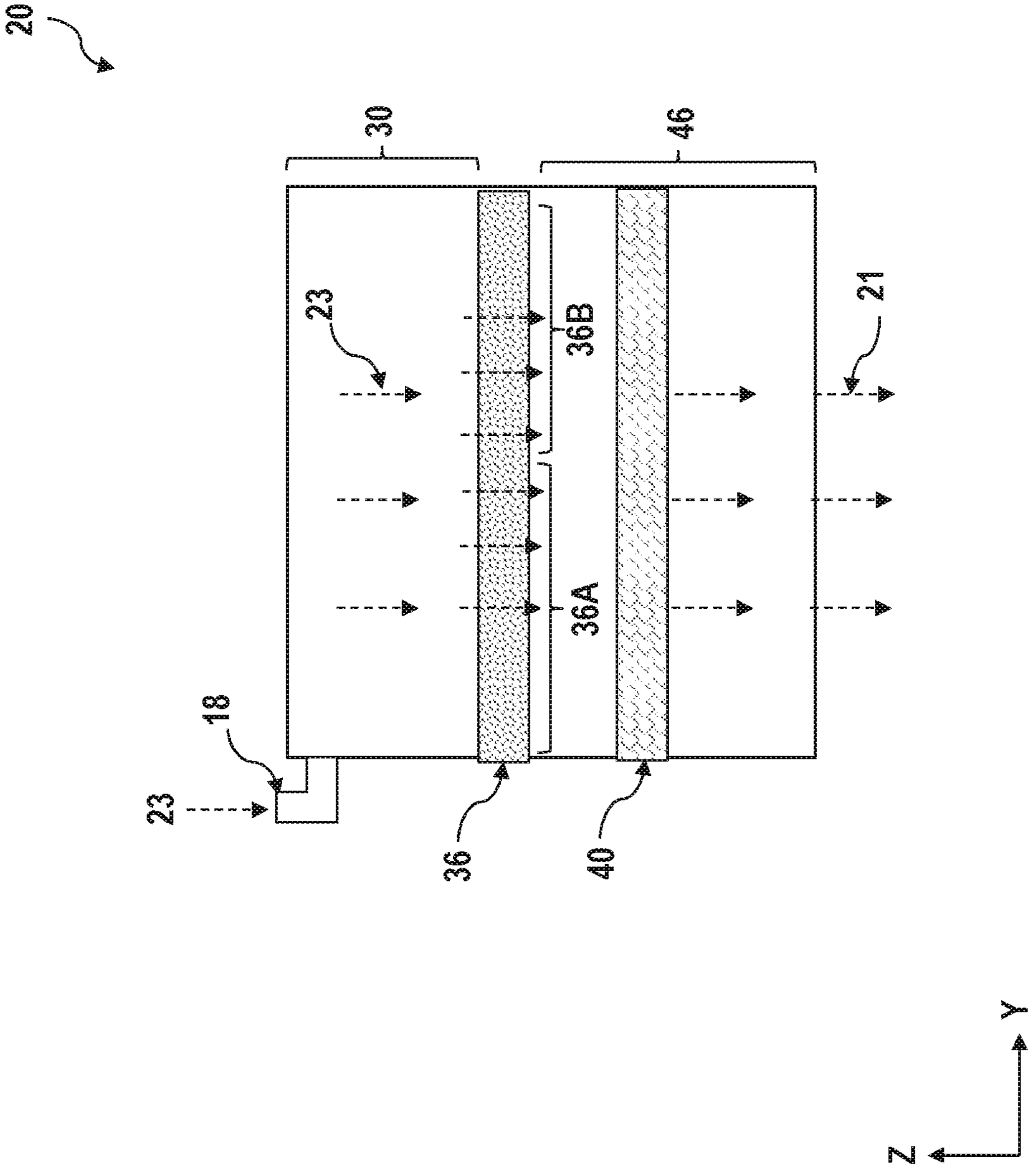
FIG. 2D is a sectional view of the wafer humidity control device constructed according to some embodiments.

FIGS. 2A and 2B are schematic views of The WHCD 20 constructed in accordance with some embodiments. FIG. 2C is a perspective view of The WHCD 20 of FIG. 2B constructed in accordance with some embodiments. FIG. 2D is a sectional view of The WHCD 20 of FIG. 2A or 2B constructed in accordance with some embodiments.

In the present embodiment, the WHCD 20 includes a gas entry layer 30 with a gas inlet 18 to introduce the gas 23 into the WHCD 20. The gas inlet 18 may include one or more gas nozzle 34 designed to distribute the air, such as toward a saturated pressure layer. In the disclosed embodiment, the gas inlet 18 includes one gas nozzle 34, as illustrated in FIG. 2A. Alternatively, the gas inlet includes multiple gas nozzles 34, such as three gas nozzles 34 as illustrated in FIG. 2B. The gas entry layer 30 also functions as a cap or lid of the WHCD 20. The gas entry layer 30 is made of one or more metal material (such as stainless steel, or aluminum alloy), other suitable material (such as glass, quartz, aluminum oxide), other suitable material or a combination thereof.

Still referring to FIG. 2A, the WHCD 20 includes a saturated pressure layer 36 with a plurality of holes 38 formed thereon. The saturated pressure layer 36 is designed to maintain or even increase the gas pressure and control the gas distribution by the holes 38. Particularly, the holes 38 are unevenly distributed on the saturated pressure layer 36 with different hole sizes and different hole densities. In the disclosed embodiment, the holes 38 are formed in two regions: a first region 36A closer to the gas inlet 18 and a second region 36B distanced far away from the gas inlet 18. For example, the first region 36A is spaced with a first distance from the gas inlet 18 and the second region 36B is spaced with a second distance from the gas inlet 18, the second distance being greater than the first distance. In furtherance of the example, the greatest distance between the gas inlet 18 and the first region 36A is less than the shortest distance between the gas inlet 18 and the second region 36B. In this case, the gas inlet 18 is configured in the gas entry layer 30 more closer to one side, as illustrated in FIG. 2D. In the disclosed structure of the WHCD 20, the gas inlet 18 is configured in one side, the saturated pressure layer 36 is divided into two regions: the first region 36A being closer to the gas inlet 18, and the second region 36B being far away from the gas inlet 18.

Figure 3:
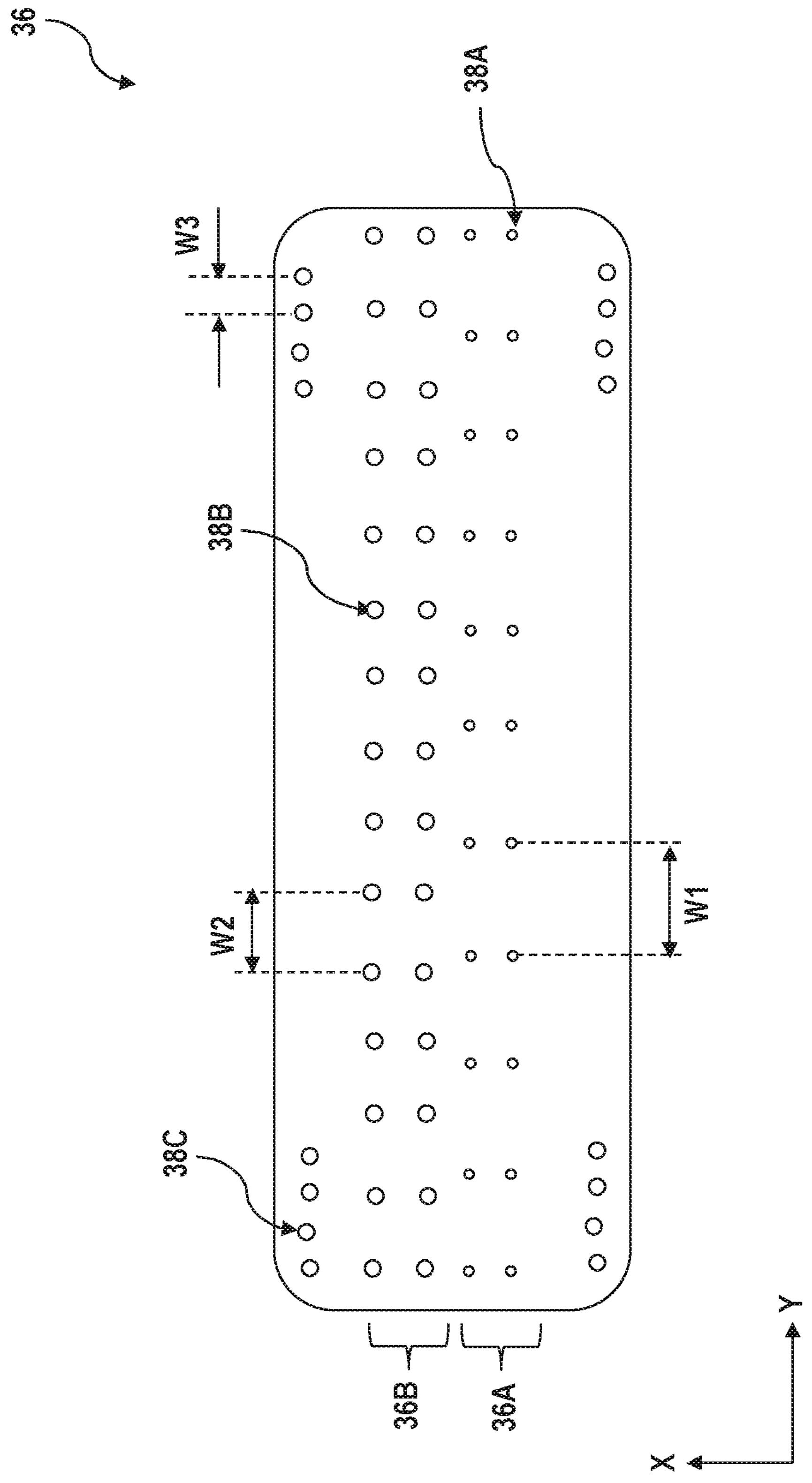
FIG. 3 is a top view of the saturated pressure layer of the wafer humidity control device, constructed according to various aspects of the present disclosure in one embodiment.

The holes 38 include a first group of holes in the first region 36A with a first hole size and a first hole density, and a second group of holes in the second region 36B with a second hole size less than the first hole size and a second hole density less than the first hole density. The design of the holes 38 helps to achieve uniform air flow. The design of the holes 38 on the saturated pressure layer 36 is further described with reference to FIG. 3. FIG. 3 is a top view of the saturated pressure layer 36 that includes the first group of holes 38A configured in the first region 36A and the second group of holes 38B configured in the second region 36B, as defined above. The saturated pressure layer 36 may further include a third group of holes 38C formed on four corners of the saturated pressure layer 36.

In the disclosed embodiment, each group of holes are configured in lines oriented along Y direction. Particularly, the first group of holes 38A is designed with a first hole diameter h1 and a first hole pitch W1 (the dimension from a hole to an adjacent hole); the second group of holes 38B is designed with a second hole diameter h2 and a second hole pitch W2; and the third group of holes 38C is designed with a third hole diameter h3 and a third hole pitch W3, wherein W1>W2>W3 and h1<h2<h3. In some embodiments, W1 ranges between 1 mm and 50 mm, and h3 ranges between 0.1 mm and 3 mm. In some embodiments, the diameter ratios h2/h1=h3/h2 range between 1.2 and 1.6; and the pitch ratios W1/W2=W2/W3 range between 1.3 and 1.8. Because the pressure is higher when close to the gas inlet 18, such configuration is designed to reduce the higher pressure region and distribute the gas so that the pressure is maintained uniformly.

In some embodiments, the holes 38C in the corner regions include a proper number of holes 38C in each corner, such as 4 or greater than 4 holes 38C in each corner. In some embodiments, the holes 38 are designed with a graded structure, the hole size and hole density gradually increase when the distance from the holes 38 to the gas inlet 18 increases. This configuration provide more freedom to distribute gas flow and maintain uniform pressure.

The saturated pressure layer 36 is made of any suitable material, including plastic or polymer, metal, glass, quartz, ceramic or a combination thereof. In some embodiments, the plastic or polymer to form the saturated pressure layer 36 includes polyethylene terephthalate (PET), High-density polyethylene (HDPE), Polyvinyl Chloride (PVC), Low-density polyethylene (LDPE), Polypropylene (PP), Polystyrene (PS), Ultra High Molecular Weight Polyethylene (UPE), polyethylene (PE), or a combination thereof. In some embodiments, the metal to form the saturated pressure layer 36 includes aluminum alloy, stainless steel, titanium alloy, other suitable metal, or a combination thereof. In some embodiments, the ceramic to form the saturated pressure layer 36 includes Aluminum Oxide ($Al_2O_3$), Zirconium Oxide ($ZrO_2$), other suitable ceramic or a combination thereof.

Still referring to FIG. 2A, the WHCD 20 includes two O-rings 44 configured on both sides of the saturated pressure layer 36 such that the saturated pressure layer 36 are seamlessly integrated with other components of the WHCD 20 to reduce the leakage. The O-ring 44 is made of a soft material, such as rubber, other suitable polymeric material or a combination thereof. The O-rings 44 will be further described with other components through the description of the WHCD 20.

Figure 4:
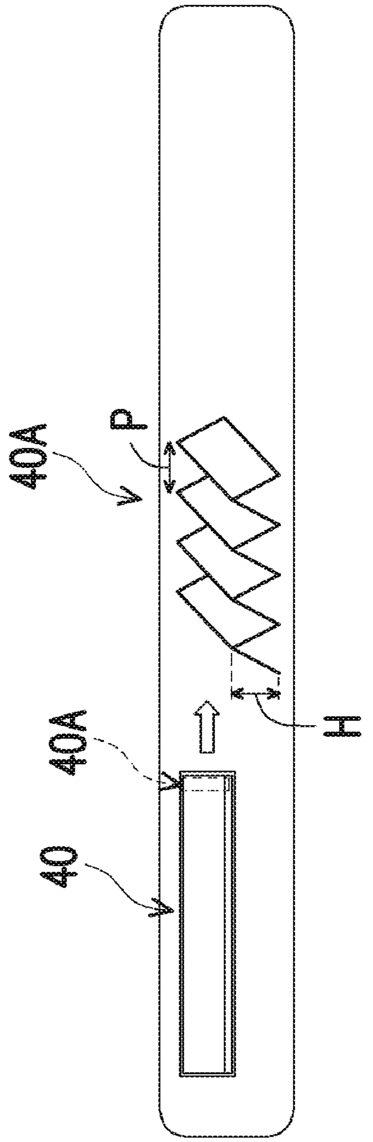
FIG. 4 is a schematic view of the uniform layer of the wafer humidity control device, constructed according to various aspects of the present disclosure in one embodiment.

Still referring to FIG. 2A, the WHCD 20 includes a uniform layer 40. The uniform layer 40 is designed with a mechanism to further control the gas 23 for its flow rate, distribution, density or pressure, flow direction, or a combination thereof. Particularly, the uniform layer 40 is shaped with an uneven surface to increase the control of the gas 23. The uniform layer 40 with such designed shape can effectively compress the gas 23 to increase the gas pressure, and also distribute the gas 23 uniformly. In the disclosed embodiment, the uniform layer 40 includes pleats 42 with a height H and pitch P. This is further illustrated in FIG. 4, in which a portion 40A of the uniform layer 40 is zoomed in and is illustrated on the right side of FIG. 4. In some examples, portions with a ratio of H/P being greater than 20 are configured closer to the gas inlet 18. In some examples, the height H ranges between 2 mm and 40 mm. The pitch P ranges between 0.1 mm and 2 mm. In yet some examples, the length of the uniform layer 40 is greater 400 mm and the numbers of the pleats is greater than 400. The uneven surface of the uniform layer 40 provides more interaction between the gas flow and the uniform layer 40, and therefore provides more control to the gas flow rate and flow direction.

The above design of the uniform layer 40 and its effectiveness are determined through theoretical analysis, experiments and simulations.

The uniform layer 40 is made of any suitable material, including plastic or polymer, such as polyethylene terephthalate (PET), High-density polyethylene (HDPE), Polyvinyl Chloride (PVC), Low-density polyethylene (LDPE), Polypropylene (PP), Polystyrene (PS), Ultra High Molecular Weight Polyethylene (UPE), polyethylene (PE), or a combination thereof. The uniform layer 40 is secured in the diversion layer, which will be described in detail later.

Still referring to FIG. 2A, the WHCD 20 includes a diversion layer 46 integrated with other components of the WHCD 20. The diversion layer 46 functions to house the uniform layer 40, direct the gas flow, and further functions as a base frame of the WHCD 20. The diversion layer 46 further provide more space for the gas 23 flowing by the uniform layer 40 so that the gas 23 can be more uniformly distributed before exiting the WHCD 20. The diversion layer 46 includes aluminum alloy, stainless steel, titanium alloy, other suitable metal, other suitable metal alloy, or a combination thereof.

The diversion layer 46 is not one-piece feature. Instead, the diversion layer 46 includes multiple pieces of parts assembled together. This design of the diversion layer 46 with multiple pieces provides more freedom of tuning the configuration of the diversion layer 46 and installation of the uniform layer 40 with eliminated or reduced stress and deformation, which further ensures the sealing structure of the WHCD 20 for improved filtering function of the WHCD 20. Accordingly, the diversion layer 46 is also referred to as a diversion structure 46. The experiments, simulations and analysis show that the uniform layer 40 is difficult to be installed in the diversion layer 46 if it is in one piece and may cause stress and deformation of the uniform layer 40. If the uniform layer is too small, there might leave gaps between the inner walls of the diversion layer and the uniform layer. If the uniform layer is too large, the uniform layer may be deformed, such as bending and protruding the rectangle frame of the diversion layer. Particularly, the installation of the uniform layer 40 in the diversion layer may take longer time and may have installation variations over individual engineers, which is not cost-effective and introduces concerns of quality control. With the disclosed diversion structure 46 having multiple pieces, the installation of the uniform layer 40 can be implemented in a well-defined procedure with well-controlled quality, reduced stress, and cost-effectiveness.

In some embodiments, the diversion layer 46 includes two end features 48 and two side features 50 with a mechanism, such as screws or other suitable fixtures, to assemble the various parts together with the uniform layer 40 secured therein. Since the diversion layer 46 includes multiple parts, the spacing between adjacent parts is tunable for reduced stress and deformation, and therefore optimized configuration.

Figure 5:
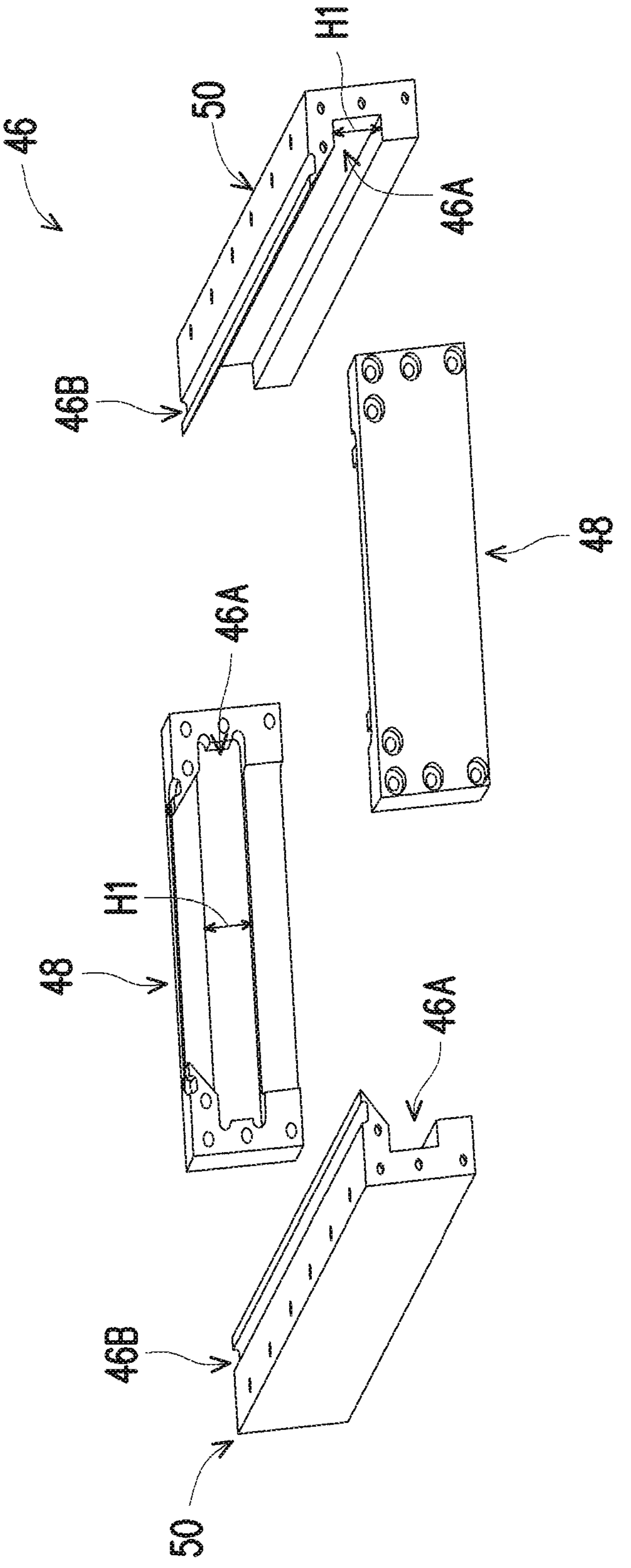
FIG. 5 is a perspective view of various parts of the diversion structure of the wafer humidity control device, constructed in accordance with some embodiments.
Figure 6A:
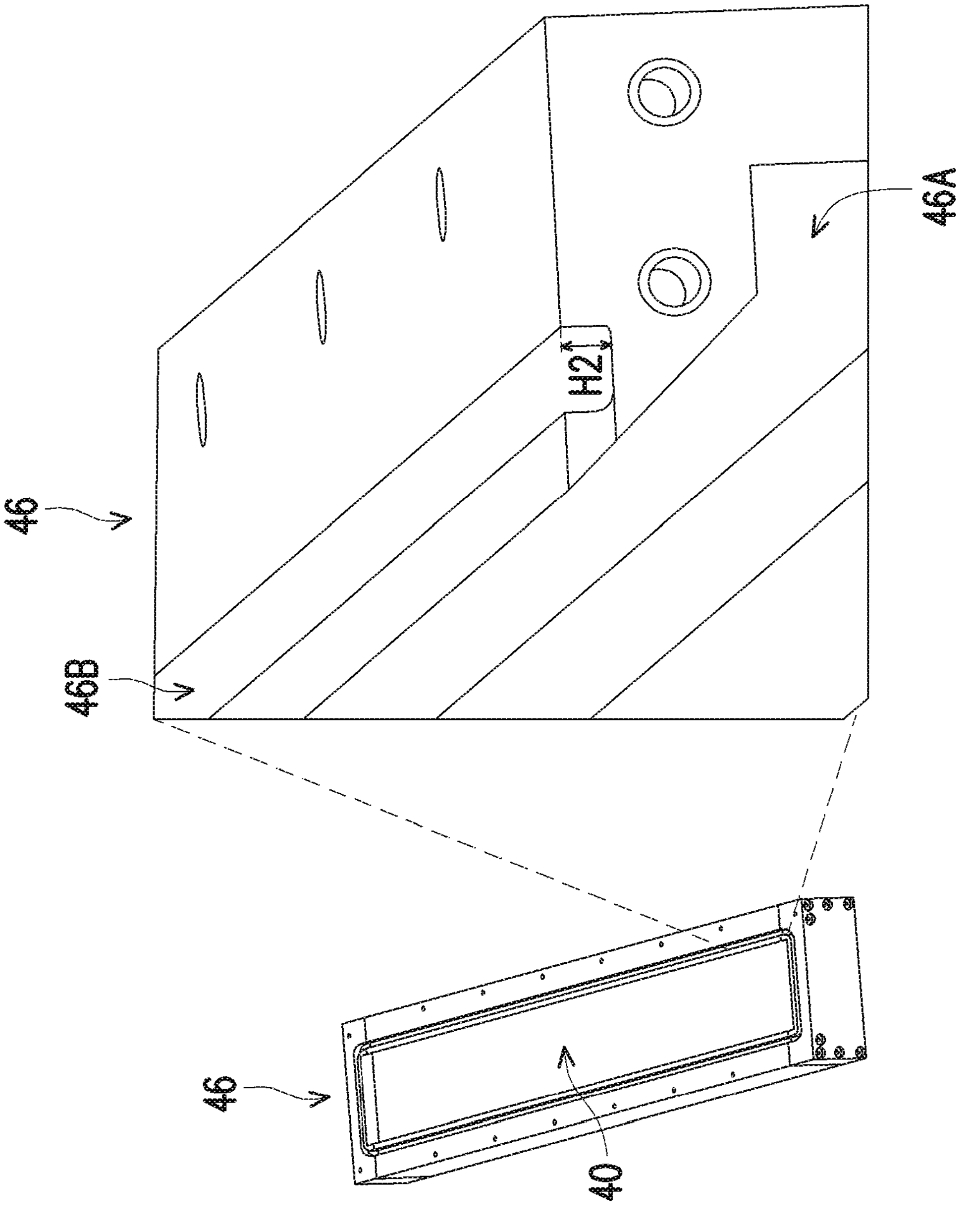
FIGS. 6A and 6B are perspective view of the diversion structure and the uniform layer of the wafer humidity control device, constructed in accordance with some embodiments.
Figure 6B:
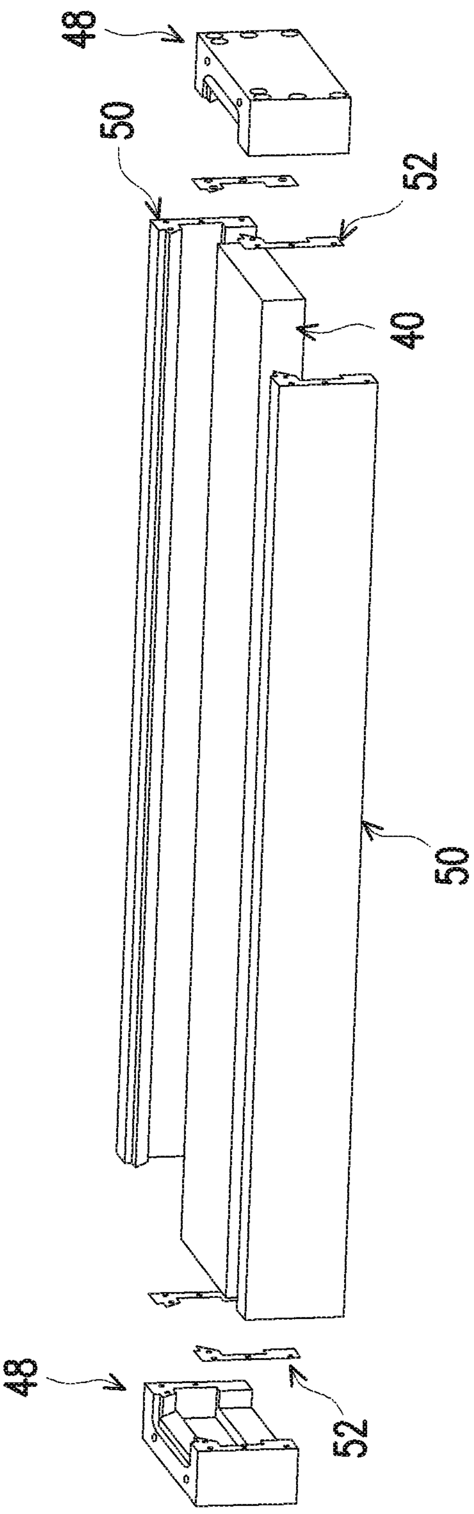

In some embodiments, various parts of the diversion structure 46 may include some recesses designed and configured to secure the uniform layer 40. This is further described with reference FIGS. 5, 6A and 6B. FIG. 5 illustrates a perspective view of various parts of the diversion structure 46, constructed in accordance with some embodiments. In the disclosed embodiments. FIGS. 6A and 6B illustrate perspective view of the diversion structure 46 and the uniform layer 40, constructed in accordance with some embodiments. In the disclosed embodiments, the diversion structure 46 includes two end features 48 and two side features 50. The end features 48 and the side features 50 include recesses 46A configured into a space to hold the uniform layer 40 when assembled together, as illustrated in FIGS. 6A and 6B. In some embodiments, the recesses 46A includes H1 as indicated in FIG. 5. The height H1 ranges between 5 mm and 20 mm according to some embodiments.

In some embodiments, additionally or alternatively, other features or materials may be applied to secure the uniform layer 40 in the diversion structure 46. In some embodiments, the diversion structure 46 further includes spacers inserted between the end features 48 and side features 50. The spacers 52 are soft pads made of suitable material, such as rubber, other suitable polymeric material, or a combination thereof. The spacers 52 are similar to the O-ring 44 in terms of function and composition designed to provide sealing effect with reduced leakage. The spacers 52 may also reduce stress and deformation due to its softness.

In some embodiments, the gas entry layer 30 include a recess (such as a groove) at a bottom surface of the gas entry layer 30 with a shape and dimensions so that the O-ring 44 is able to fit in. Similarly, the diversion structure 46 further includes recesses (such as a grooves) 46B at a top surface with a shape and dimensions so that the O-ring 44 is able to fit in. In this case, the recesses 46B of the diversion structure 46 for the O-ring 44 are formed on various features, such as the end features 48 and the side features 50 of the diversion structure 46. The recesses 4B includes a height H2, as indicated in FIG. 6A. The height H2 ranges between 0.1 mm and 5 mm according to some embodiments.

Figure 7:
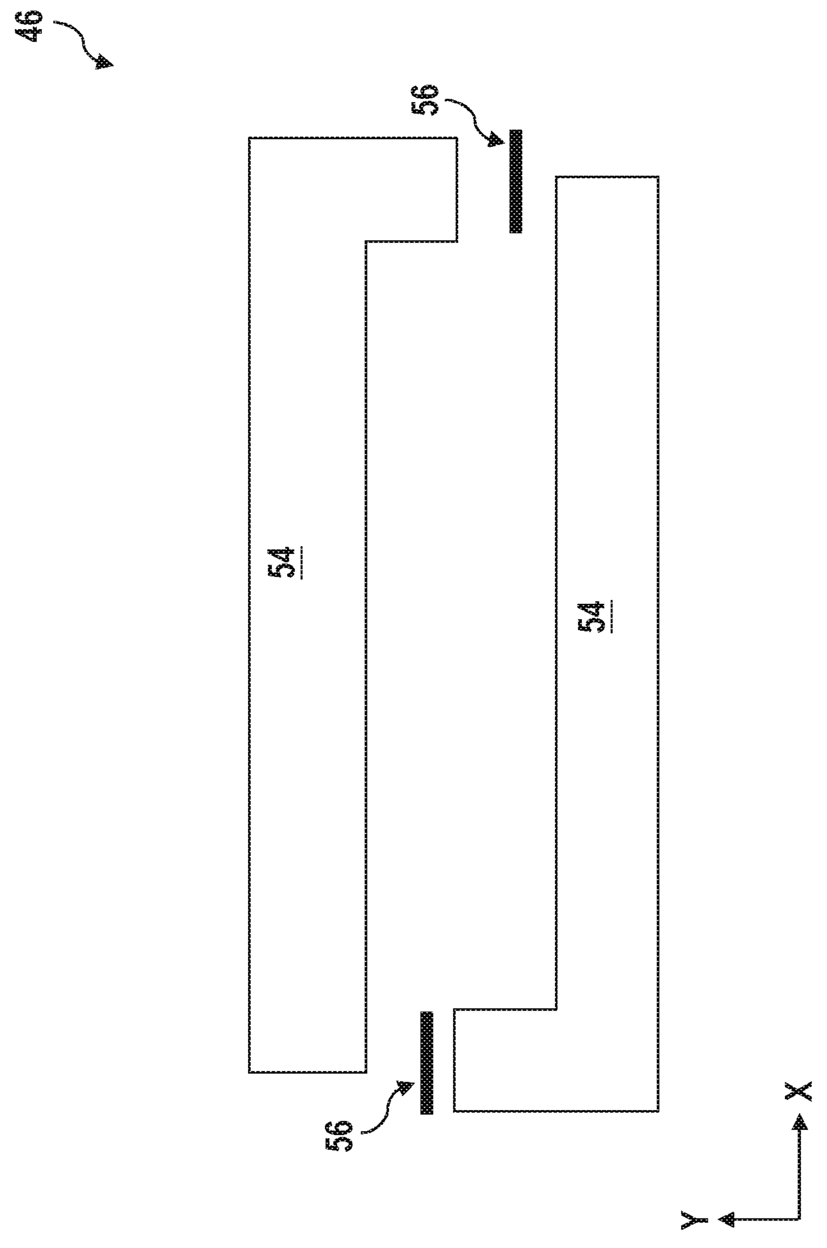
FIG. 7 is a top view of the diversion structure of the wafer humidity control device, constructed according to various aspects of the present disclosure in one embodiment.

The diversion structure 46 may include a greater or smaller number of parts designed and configured to perform the same functions. In some embodiments, the diversion layer 46 includes two L-shaped features 54 as illustrated in FIG. 7 in a top view. Each L-shaped feature 54 functions as a combination of one end feature 48 and one side feature 50. In furtherance of the embodiments, the diversion structure 46 may further include two spacers 56 inserted between the interfaces of the two L-shaped features 54. The spacers 56 are similar to the spacers 52 in terms of composition and function. The L-shaped features 54 also include grooves for the O-ring 44 on the top and recesses on inner walls designed with space to house the uniform layer 40.

The present disclosure provides a structure of a wafer humidity control device embedded in an equipment front end module. The wafer humidity control device is designed with a mechanism to generate an air curtain with suitable gas flow, gas pressure and gas distribution to effectively isolate and protect semiconductor wafers stored in wafer carrier, which is positioned on a load port of the equipment front end module. The wafer humidity control device includes a gas entry layer, a saturated pressure structure, a uniform layer and a diversion structure integrated together. Especially, the diversion structure includes multiple pieces assembled together so that the uniform layer can be easily installed in the diversion structure and hold therein. Various embodiments of the wafer humidity control device, especially the diversion structure thereof, are provided. Various advantages may present in various embodiments. By utilizing the disclosed structure of the wafer humidity control device, the installation of the uniform layer can be implemented in a well-defined procedure with well-controlled quality. Furthermore, the diversion structure in multiple pieces provide more freedom to tune with reduced stress and deformation of the uniform layer when installing inside the diversion structure.

In one example aspect, the present disclosure provides a semiconductor fabrication system. The semiconductor fabrication system includes an equipment front end module with a load port to transfer semiconductor wafers to the equipment front end module from a wafer carrier; and a wafer humidity control device embedded in the equipment front end module and configured to generate an air curtain to protect the semiconductor wafers. The wafer humidity control device further includes a gas entry layer with a gas inlet to receive a gas; a uniform layer integrated with the gas entry layer and designed to redistribute the gas; and a diversion structure having multiple pieces assembled together to hold the uniform layer and integrated with the gas entry layer.

Another one aspect of the present disclosure pertains to a semiconductor fabrication system. The semiconductor fabrication system includes an equipment front end module with a load port to transfer semiconductor wafers to the equipment front end module from a wafer carrier; and a wafer humidity control device embedded in the equipment front end module and configured to generate an air curtain to protect the semiconductor wafers. The wafer humidity control device further includes a gas entry layer with a gas inlet to receive a gas; a uniform layer integrated with the gas entry layer and designed to redistribute the gas; a diversion structure having multiple pieces assembled together and holding the uniform layer; and a saturated pressure layer designed to maintain a pressure of the gas and configured between the gas entry layer and the diversion structure.

Yet another aspect of the present disclosure pertains to a semiconductor fabrication system. The semiconductor fabrication system includes an equipment front end module with a load port to transfer semiconductor wafers to the equipment front end module from a wafer carrier; a processing tool coupled with the equipment front end module and designed for applying a fabrication process to the semiconductor wafers; and a wafer humidity control device embedded in the equipment front end module and configured to generate an air curtain to protect the semiconductor wafers. The wafer humidity control device further includes a gas entry layer with a gas inlet to receive a gas; a uniform layer integrated with the gas entry layer and designed to redistribute the gas; a diversion structure having two L-shaped features assembled together and housing the uniform layer; and a saturated pressure layer designed to maintain a pressure of the gas and secured between the gas entry layer and the diversion structure.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor fabrication system, comprising:

an equipment front end module with a load port to transfer semiconductor wafers to the equipment front end module from a wafer carrier; and a wafer humidity control device embedded in the equipment front end module and configured to generate an air curtain to protect the semiconductor wafers, wherein the wafer humidity control device further includes a gas entry layer with a gas inlet to receive a gas;

a uniform layer integrated with the gas entry layer and designed to redistribute the gas;

and a diversion structure having multiple pieces assembled together to hold the uniform layer and integrated with the gas entry layer; and a saturated pressure layer integrated with the gas entry layer and the diversion structure, the saturated pressure layer being designed with a structure to maintain a pressure of the gas, wherein the saturated pressure layer includes a first group of holes configured in a first region closer to the gas inlet, and a second group of holes configured in a second region distanced far away from the gas inlet, the first group of holes has a first hole size and a first pitch among the first group of holes, and the second group of holes has a second hole size greater than the first hole size and a second pitch less than the first pitch, wherein the saturated pressure layer further includes a third group of holes configured in four corners of the saturated pressure layer; and the third group of holes has a third hole size greater than the second hole size and a third pitch less than the second pitch.

2. The semiconductor fabrication system of claim 1, wherein the gas inlet is coupled with a gas source to receive the gas that includes one of nitrogen gas and extreme clean dry air.

3. The semiconductor fabrication system of claim 1, wherein the diversion structure includes two end features and two side features assembled together and holding the uniform layer.

4. The semiconductor fabrication system of claim 3, wherein the diversion structure further includes spacers each being inserted in an interface between one of the end features and one of side features.

5. The semiconductor fabrication system of claim 1, wherein the diversion structure includes two L-shaped features assembled together and holding the uniform layer.

6. The semiconductor fabrication system of claim 1, further comprising two O-rings configured on opposite sides of the saturated pressure layer such that a first side of the saturated pressure layer is attached to the diversion structure through one of the two O-rings and another side of the saturated pressure layer is attached to the gas entry layer through another one of the two O-rings.

7. The semiconductor fabrication system of claim 6, wherein the uniform layer includes a composition of a plastic material and a polymeric material;

the uniform layer is shaped with a plurality of pleats having a height H and a pitch P; and a ratio H/P is greater than 20.

8. The semiconductor fabrication system of claim 6, wherein the first group of holes has a first hole density; and the second group of holes has a second hole density greater than the first hole density.

9. The semiconductor fabrication system of claim 7, wherein the saturated pressure layer includes a material selected from the group consisting of a metal, a glass, a quartz, a ceramic material, a polymer, and a combination thereof.

10. The semiconductor fabrication system of claim 1, comprising a processing tool integrated with the equipment front end module and designed for applying a process to the semiconductor wafers.

11. The semiconductor fabrication system of claim 10, wherein the processing tool is designed for applying at least one of fabrication processes, measurements and tests to the semiconductor wafers.

12. The semiconductor fabrication system of claim 11, wherein the fabrication processes include deposition, etching, ion implantation, chemical mechanical polishing (CMP), photolithography process, or a combination thereof.

13. A semiconductor fabrication system, comprising:

an equipment front end module with a load port to transfer semiconductor wafers to the equipment front end module from a wafer carrier; and a wafer humidity control device embedded in the equipment front end module and configured to generate an air curtain to protect the semiconductor wafers, wherein the wafer humidity control device further includes a gas entry layer with a gas inlet to receive a gas;

a uniform layer integrated with the gas entry layer and designed to redistribute the gas;

a diversion structure having multiple pieces assembled together and holding the uniform layer; and a saturated pressure layer designed to maintain a pressure of the gas and configured between the gas entry layer and the diversion structure, wherein the saturated pressure layer includes a first group of holes configured in a first region closer to the gas inlet, and a second group of holes configured in a second region distanced far away from the gas inlet, the first group of holes has a first hole size and a first pitch among the first group of holes, and the second group of holes has a second hole size greater than the first hole size and a second pitch less than the first pitch, wherein the saturated pressure layer further includes a third group of holes configured in four corners of the saturated pressure layer; and the third group of holes has a third hole size greater than the second hole size and a third pitch less than the second pitch.

14. The semiconductor fabrication system of claim 13, wherein the diversion structure includes two end features and two side features assembled together and holding the uniform layer; and four spacers each being inserted in an interface between one of the end features and one of side features.

15. The semiconductor fabrication system of claim 13, wherein the diversion structure includes two L-shaped features assembled together and holding the uniform layer; and two spacers each being inserted in an interface between the two L-shaped features.

16. The semiconductor fabrication system of claim 13, wherein the uniform layer includes a composition of a plastic material and a polymeric material;

the uniform layer is shaped with a plurality of pleats having a height H and a pitch P; and a ratio H/P is greater than 20.

17. A semiconductor fabrication system, comprising:

an equipment front end module with a load port to transfer semiconductor wafers to the equipment front end module from a wafer carrier;

a processing tool coupled with the equipment front end module and designed for applying a fabrication process to the semiconductor wafers; and a wafer humidity control device embedded in the equipment front end module and configured to generate an air curtain to protect the semiconductor wafers, wherein the wafer humidity control device further includes a gas entry layer with a gas inlet to receive a gas;

a uniform layer integrated with the gas entry layer and designed to redistribute the gas;

a diversion structure having two L-shaped features assembled together and housing the uniform layer; and a saturated pressure layer designed to maintain a pressure of the gas and secured between the gas entry layer and the diversion structure, wherein the saturated pressure layer includes a first group of holes configured in a first region closer to the gas inlet, a second group of holes configured in a second region distanced far away from the gas inlet, and a third group of holes configured in four corners of the saturated pressure layer, the first group of holes has a first hole size and a first pitch among the first group of holes, the second group of holes has a second hole size greater than the first hole size and a second pitch less than the first pitch, and the third group of holes has a third hole size greater than the second hole size and a third pitch less than the second pitch.

18. The semiconductor fabrication system of claim 17, further comprising two O-rings configured on opposite sides of the saturated pressure layer such that a first side of the saturated pressure layer is attached to the diversion structure through one of the two O-rings and another side of the saturated pressure layer is attached to the gas entry layer through another one of the two O-rings, wherein the uniform layer is shaped with a plurality of pleats having a height H, a pitch P, and a ratio H/P greater than 20.

* * * * *